(12) United States Patent
Yamada

(10) Patent No.: US 6,366,142 B1
(45) Date of Patent: Apr. 2, 2002

(54) BUFFER CIRCUIT HAVING SCHOTTKY GATE TRANSISTORS ADJUSTING AMPLITUDE OF OUTPUT SIGNAL

(75) Inventor: Hiroyuki Yamada, Kanagawa (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/694,326

(22) Filed: Oct. 24, 2000

(30) Foreign Application Priority Data

Oct. 29, 1999 (JP) .......................................... 11-309541

(51) Int. Cl.[7] .............................. H03B 1/00; H03K 3/00
(52) U.S. Cl. ...................... 327/112; 327/435; 327/389; 326/83; 326/116
(58) Field of Search ................................. 327/379, 430, 327/431, 435, 427, 581, 108, 112, 389; 326/68, 69, 72, 120, 116, 117, 83, 87

(56) References Cited

U.S. PATENT DOCUMENTS

| | | | |
|---|---|---|---|
| 3,655,996 A | * 4/1972 | Takahashi | 327/430 |
| 4,264,829 A | * 4/1981 | Misaizu | 326/120 |
| 4,296,339 A | * 10/1981 | Murotani | 326/120 |
| 4,412,139 A | * 10/1983 | Horninger | 326/87 |
| 4,477,741 A | * 10/1984 | Moser, Jr. | 326/87 |
| 4,746,824 A | * 5/1988 | Magome et al. | 327/379 |
| 4,757,478 A | * 7/1988 | Ducourant et al. | 326/106 |
| 4,844,563 A | 7/1989 | MacMillan et al. | 307/475 |
| 5,336,949 A | * 8/1994 | Mimura | 326/117 |
| 5,592,108 A | * 1/1997 | Tsukahara | 326/116 |

FOREIGN PATENT DOCUMENTS

| | | | |
|---|---|---|---|
| JP | 02166829 | | 6/1990 |
| JP | 2-166829 | * | 6/1990 |

* cited by examiner

Primary Examiner—Toan Tran
Assistant Examiner—Long Nguyen
(74) Attorney, Agent, or Firm—Junichi Mimura

(57) ABSTRACT

A buffer circuit having an input and output terminals includes a first Schottky gate transistor connected between a voltage setting node and ground, a load device connected between a power supply and the voltage setting node, a second Schottky gate transistor connected between the output terminal and ground, the gate of the second Schottky gate transistor being connected to the voltage setting node, a third Schottky gate transistor connected between the output terminal and the power supply, the gate of the third Schottky gate transistor being connected to the input terminal, a resistor means connected the gate of the first Schottky gate transistor and input terminal for increasing a voltage level applied to the gate of the third Schottky gate transistor.

5 Claims, 2 Drawing Sheets

BUFFER CIRCUIT HAVING SCHOTTKY GATE TRANSISTORS ADJUSTING AMPLITUDE OF OUTPUT SIGNAL

CROSS-REFERENCE TO RELATED APPLICATION

This application claims the priority benefit of Japanese Patent Application No. 11-309541, filed Oct. 29, 1999, the entire disclosure of which is incorporated herein of reference.

BACKGROUND OF THE INVENTION

1. Field of the invention

The invention relates to a buffer circuit, which is used as an output buffer or a clock buffer of a semiconductor integrated circuit (IC).

2. Description of the Related Art

Details of a prior buffer circuit is disclosed in a Japanese translation by Kanno and Sakaki of the first edition of "An Introduction to VLSI System" at pages 21–22, authored by C. Code and L. Conway, and published by Baifukan on Jun. 30, 1981. FIG. 2 is a circuit diagram of a buffer circuit 100 that is illustrated in the above-mentioned publication.

Generally, a GaAs MES FET is widely used in ICs as a Schottky gate FET because of its characteristics of high speed and high integration. The buffer circuit 100 shown in FIG. 2 is used in an output part of an IC having GaAs MES FETs, and outputs a binary operation signal Sout, which corresponds to an input signal Sin applied from an internal circuit of the IC, to an unillustrated circuit connected to a output terminal OUT The buffer circuit 100 include two enhancement type FETs 1, 3 and two depletion type FETs 2, 4 an input terminal IN and the output terminal OUT. The gate of the FET 1 is connected to the input terminal IN which receives the input signal Sin, and the source is connected to ground GND.

The source and the gate of the FET 2 are connected to the drain of the FET 1 at a voltage setting node N1, and the drain is connected to a power supply voltage VD. The FET 2 acts as a load element against the FET 1.

The gate of the FET 3 is connected to the node N1, and the source of the FET 3 is connected to ground GND. The drain of the FET 3 is connected to the output terminal OUT.

The source of the FET 4 is connected to the drain of the FET 3, and the drain of the FET 4 is connected to the power supply voltage VD. Since the gate of the FET 4 is connected to the input terminal IN, the condition of a current path in the FET 4 is 1s changed in response to the voltage of the input signal Sin.

The operation of the buffer circuit 100 shown in FIG. 2 is explained below. As an initial status, when the voltage level of the input signal Sin at the input terminal IN is at an L (low) level, the FET 1 is in a first condition that the current is not easily passed through a transistor because a high resistance value is applied between the source and drain of the FET 1. On the other hand, the FET 2 is in a second condition that the current is easily passed through a transistor because a low resistance value is applied between the source and drain of the FET 2. Therefore, the voltage level at the node N1 is the supply voltage level approximately. Further, since a resistance value between the source and drain of the FET 3 becomes lower, the FET 3 is in the second condition. Moreover, since a resistance value between the source and drain of the FET 4 becomes lower in response to the low level input signal Sin, the FET 4 is in the second condition. However, comparing the resistance value of the FET 3 with that of the FET 4, the resistance value of the FET 3 is lower than that of the FET4. Therefore, since the output terminal OUT is electrically connected to ground GND, the voltage level of the operation signal Sout at the output terminal OUT is at the L level.

When the voltage level of the input signal Sin is changed from the L level to the H (high) level, the FET 1 becomes the second condition, and the current is more easily passed through the FET 4 because its resistance value becomes lower in response to the H level input signal Sin. Since the voltage at the node N1 begins to fall when the FET 1 is in the second condition, the gate voltage of the FET 3 also begins to fall. Further, since the output terminal OUT is electrically connected to the power supply voltage VD through the FET 4 when the current is more easily passed through the FET 4, the voltage at the output terminal OUT begins to rise. When the voltage at the node N1 becomes less than the threshold voltage of the FET 3, the FET 3 is in the first condition. Then, since the rise in the voltage at the output terminal OUT is accelerated, the voltage level of the output terminal OUT rises to the H level. Therefore, the operation signal Sout having the H level is output from the output terminal OUT Then, when the voltage level of the input signal Sin is changed from the H level to the L level, the FET 1 becomes the first condition, and the current is not easily passed through the FET 4 again. Since the voltage at the node N1 begins to rise when the FET 1 is in the first condition, the gate voltage of the FET 3 also begins to rise. Further, the output terminal OUT is electrically disconnected from the power supply voltage VD when the current is not easily passed through the FET 4. When the voltage at the node N1 exceeds the threshold voltage of the FET 3, the FET 3 becomes the second condition. Then, since the output terminal OUT is electrically connected to ground GND through the FET 3, the voltage level of the output terminal OUT falls to the L level. Therefore, the operation signal Sout having the L level is output from the output terminal OUT.

In the buffer circuit shown in FIG. 2, when a large voltage amplitude of the operation signal Sout should be obtained, it has been considered to apply a high voltage to the gate of the FET 4 in order to increase the conductance of the FET 4. However, the voltage of the input signal Sin that indicate the H level, which is applied to the gate of the FET 4, is clamped at about 0.7 V, which voltage is determined by a current that flows from the gate of the FET 1 to ground GND through the source of the FET 1. In this buffer circuit, since it is difficult to apply a high voltage to the gate of the FET 4, the desirable voltage amplitude can not be obtained. Therefore, to obtain an operation signal Sout with a large voltage amplitude, the width of the FET 3 should be adjusted. However, other problems, for example, circuit design restrictions may occur.

SUMMARY OF THE INVENTION

An objective of the invention is to resolve the above-described problem and to provide a buffer circuit, which outputs an operation signal having a large voltage amplitude.

The objective is achieved by a buffer circuit having an input and output terminals, which includes a first Schottky gate transistor connected between a voltage setting node and ground, a load device connected between a power supply and the voltage setting node, a second Schottky gate transistor connected between the output terminal and ground, the gate of the second Schottky gate transistor being connected to the voltage setting node, a third Schottky gate transistor connected between the output terminal and the power supply, the gate of the third Schottky gate transistor being connected to the input terminal, a resistor means connected the gate of the first Schottky gate transistor and input terminal for increasing a voltage level applied to the gate of the third Schottky gate transistor.

BRIEF DESCRIPTION OF THE DRAWINGS

The invention will be more particularly described with reference to the accompanying drawings in which.

DETAILED DESCRIPTION OF THE PREFERRED EMBODIMENTS

Figure 1:
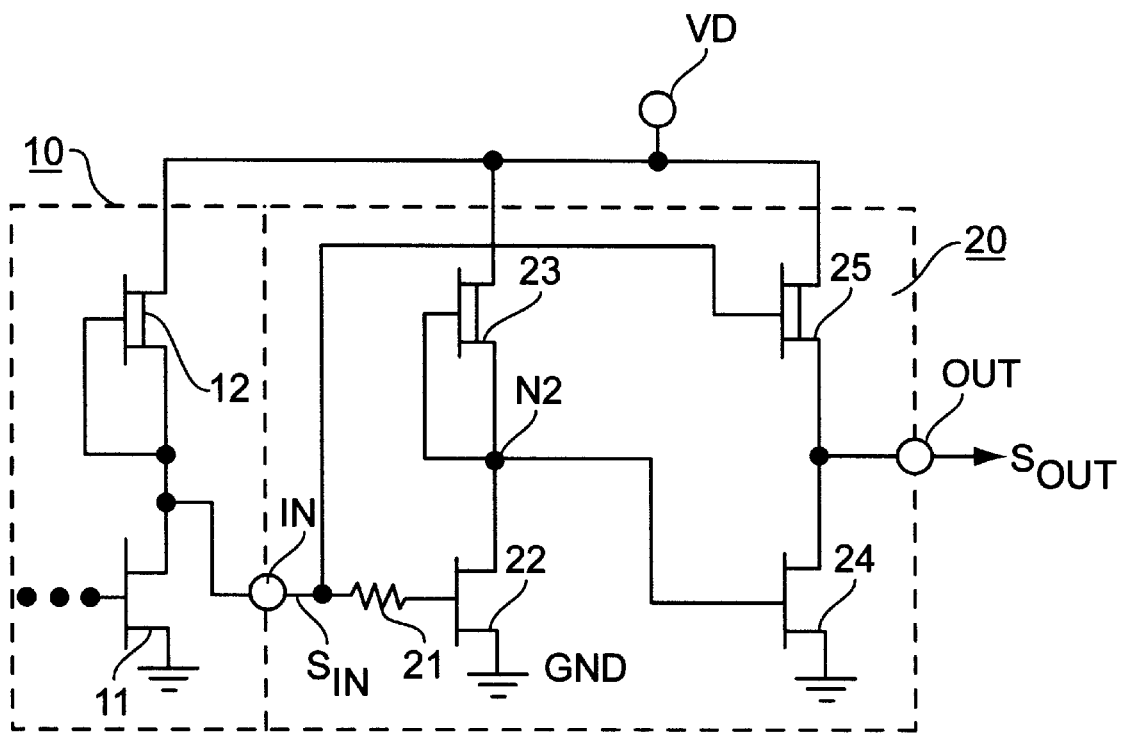
FIG. 1 is a circuit diagram of a buffer circuit of the invention.

Referring to FIG. 1, a buffer circuit 20 is used in an output part of an IC having GaAs MES FETs, and outputs a binary operation signal Sout, which corresponds to an input signal Sin applied from an internal circuit 10 of the IC, to an unillustrated circuit connected to a output terminal OUT. The last part of the internal circuit 10 is formed of a DCFL (Direct Coupling FET Logic), which includes an enhancement type FET 11 and a depletion type FET 12, wherein the FET 11 has a source connected to a ground GND and the FET 12 has a source and a gate which are connected to the drain of the FET 11. The drain of the FET 12 is connected to a power supply voltage VD. A connecting node between the FET 11 and the FET 12 is connected to an input terminal of the buffer circuit 20.

Figure 2:
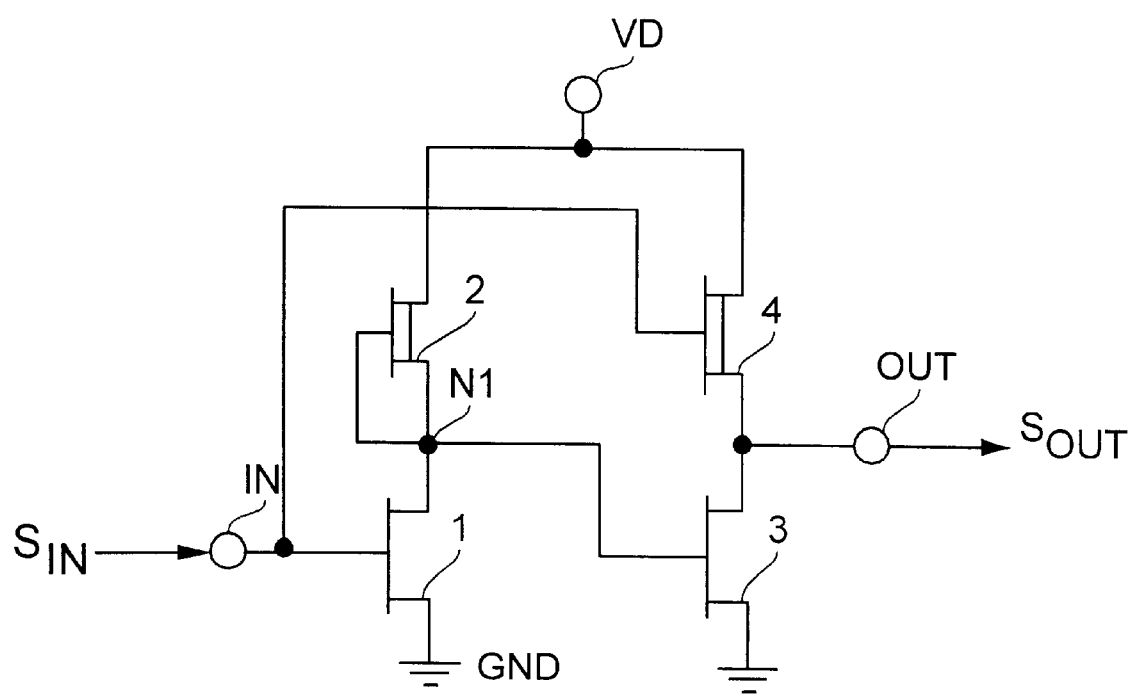
FIG. 2 is a circuit diagram of a conventional buffer circuit.

The feature of the buffer circuit 20 is to form a resistor 21 in the conventional buffer circuit shown in FIG. 2. That is, the buffer circuit 20 include the resistor 21, a first enhancement type GaAs MES FET 22, a second enhancement type GaAs MES FET 24, a first depletion type GaAs MES FET 23, a second depletion type GaAs MES FET 25, the input terminal IN and the output terminal OUT. These FETs 22–25 are Schottky gate type FETs. One end of the resistor is connected to the input terminal IN, and the other end is connected to the gate of the FET 22 whose source is connected to ground GND.

The source and the gate of the FET 23 are connected to the drain of FET 22 at a voltage setting node N2, and the drain of the FET 23 is connected to a power supply voltage VD. The FET 23 acts as a load element against the FET 22.

The gate of the FET 24 is connected to the node N2, and the source of the FET 24 is connected to ground GND. The drain of the FET 24 is connected to the output terminal OUT.

The source of the FET 25 is connected to the drain of FET 24, and the drain of the FET 25 is connected to the power supply voltage VD. Since the gate of the FET 25 is connected to the input terminal IN, a condition of a current path in the FET 25 is changed in response to the voltage of the input signal Sin.

The operation of the buffer circuit 20 shown in FIG. 1 is explained below. As an initial status, when the voltage level of the input signal Sin at the input terminal IN is at an L (low) level, The FET 22 is in a first condition that the current is not easily passed through a transisitor because a high resistance value is applied between the source and drain of the FET 22. On the other hand, the FET 23 is in a second condition that the current is easily passed through a transisitor because a low resistance value is applied between the source and drain of the FET 23. Therefore, the voltage level at the node N1 is the supply voltage level approximately. Further, since a resistance value between the source and drain of the FET 24 becomes lower, the FET 24 is in the second condition. Moreover, since a resistance value between the source and drain of the FET 25 becomes lower in response to the low level input signal Sin, the FET 25 is in the second condition. However, comparing the resistance value of the FET 24 with that of the FET 25, the resistance value of the FET 24 is lower than that of the FET 25. Therefore, since the output terminal OUT is electrically connected to ground GND, the voltage level of the operation signal Sout at the output terminal OUT is at the L level.

When the voltage level of the input signal Sin is changed from the L level to a H (high) level, the FET 22 becomes the second condition, and the current is more easily passed through the FET 25 because its resistance value becomes lower in response to the H level input signal Sin. Since the voltage at the node N2 begins to fall when the FET 22 is in the second condition, the gate voltage of the FET 24 also begins to fall. Further, since the output terminal OUT is electrically connected to the power supply voltage VD through the FET 25 when the current is more easily passed through the FET 25, the voltage at the output terminal OUT begins to rise. When the voltage at the node N2 becomes less than the threshold voltage of the FET 24, the FET 24 is in the first condition. Then, since the rise in the voltage at the output terminal OUT is accelerated, the voltage level of the output terminal OUT rises to the H level. Therefore, the operation signal Sout having the H level is output from the output terminal OUT Specifically, the voltage level corresponding to the H level in this buffer circuit 20 is higher than that of the H level in the conventional buffer circuit 100. In the conventional buffer circuit 100 shown in FIG. 2, since no resistor is formed between the input terminal IN and the gate of the FET 1, the voltage, which is applied to the gate of the FET 4, is clamped at 0.7 V by the FET 1. However, in the buffer circuit 20 shown in FIG. 1, the resistor 21 is formed between the input terminal IN and the gate of the FET 22. As a result, a current that ought to flow to ground GND from the gate through the source of the FET 22, flows to the resistor 21. Therefore, the voltage, which is increased from the clamped voltage by the product of the resistor value of the resistor 21 multiplying an amount of the current that flows to the resistor 21, is applied to the gate of the FET 25. Therefore, since the conductance of the FET 25 is increased, the voltage of the operation signal which is at the H level is further increased.

Then, when the voltage level of the input signal Sin is changed from the H level to the L level, the FET 22 becomes the first condition, and the current is not easily passed through the FET 25 again. Since the voltage at the node N2 begins to rise when the FET 22 is in the first condition, the gate voltage of the FET 24 also begins to rise. Further, the output terminal OUT is electrically disconnected from the power supply voltage VD when the current is not easily passed through the FET 25. When the voltage at the node N2 exceeds the threshold voltage of the FET 24, the FET 24 becomes the second condition. Then, since the output terminal OUT is electrically connected to the ground GND through the type FET 24, the voltage level of the output terminal OUT falls to the L level. Therefore, the operation signal Sout having the L level is output from the output terminal OUT.

According to this embodiment of the invention, since the resistor 21 is formed between the input terminal IN and the gate of the FET 22, it is possible to obtain a large voltage amplitude of the operation signal Sout without changing the gate length of the FET 25.

While the invention has been described with reference to illustrative embodiments, this description is not intended to be construed in a limiting sense. For example, although a standard resistor having a fixed resistance value is used in the embodiment, a variable resistor whose resistance value can be changed, also can be used. Further, a FET whose conductance is changed by a control signal can be used instead of the resistor. Further, the resistor 21 can be formed outside the circuit as a peripheral device. Furthermore, in this embodiment, the FET 23 used as a load element can be replaced to a resistor. In addition, although the invention is used in the buffer circuit 20 of an output buffer of an integrated circuit in the embodiment, it is possible to apply this invention to a clock buffer of an internal IC circuit. Various other modifications of the illustrated embodiments, as well as other embodiments of the invention, will be apparent to those skilled in the art on reference to this description. Therefore, the appended claims are intended cover any such modifications or embodiments as fall within the true scope of the invention.

What I claim is:

1. A buffer circuit having input and output terminals, comprising
   a first Schottky gate transistor connected between a voltage setting node and ground;
   a load device connected between a power supply and the voltage setting node;
   a second Schottky gate transistor connected between the output terminal and ground, the gate of the second Schottky gate transistor being connected to the voltage setting node;
   a third Schottky gate transistor connected between the output terminal and the power supply, the gate of the third Schottky gate transistor being connected to the input terminal; and
   a resistor means connected between the gate of the first Schottky gate transistor and the input terminal for applying a voltage level, which is a sum of a clamp voltage of the first Schottky gate transistor and the product of a resistance value of the resistor means and a current passing through the resistor means, to the gate of the third Schottky gate transistor.

2. A buffer circuit as claimed in claim 1, wherein the load device is formed of a fourth Schottky gate transistor having a gate-source connection.

3. A buffer circuit as claimed in claim 2, wherein the first and second Schottky gate transistors are enhancement type field effect transistors, and the third and fourth transistors are depletion type transistors.

4. A buffer circuit as claimed in claim 1, wherein the resistor means is a resistor having a fixed resistance value.

5. A buffer circuit as claimed in claim 1, wherein the resistor means is a variable resistor whose resistance value can be changed.

* * * * *